United States Patent
Horng et al.

(10) Patent No.: US 8,456,893 B2
(45) Date of Patent: Jun. 4, 2013

(54) MAGNETIC TUNNEL JUNCTION (MTJ) TO REDUCE SPIN TRANSFER MAGNETIZATION SWITCHING CURRENT

(75) Inventors: Cheng T. Horng, San Jose, CA (US); Ru-Ying Tong, Los Gatos, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 928 days.

(21) Appl. No.: 12/584,971

(22) Filed: Sep. 15, 2009

(65) Prior Publication Data

US 2010/0009467 A1 Jan. 14, 2010

Related U.S. Application Data

(62) Division of application No. 11/699,875, filed on Jan. 30, 2007, now Pat. No. 7,598,579.

(51) Int. Cl.
*G11C 11/00* (2006.01)

(52) U.S. Cl.
USPC ........... 365/158; 365/148; 365/171; 977/933; 977/935

(58) Field of Classification Search
USPC .................. 365/48, 55, 62, 66, 74, 78, 80–93, 365/100, 130, 131, 148, 158, 171–173, 209, 365/213, 225.5, 230.07, 232, 243.5; 257/295, 257/421, 422, 427, E21.665, E27.006, E29.323; 438/3; 428/810–816, 817–825.1, 826; 977/933–935
See application file for complete search history.

(56) References Cited

U.S. PATENT DOCUMENTS

| | | | |
|---|---|---|---|
| 6,338,899 B1 * | 1/2002 | Fukuzawa et al. | 360/324.12 |
| 6,519,124 B1 * | 2/2003 | Redon et al. | 360/324.2 |
| 6,831,312 B2 | 12/2004 | Slaughter et al. | |
| 6,990,014 B2 | 1/2006 | Hosomi et al. | |
| 7,008,702 B2 | 3/2006 | Fukuzawa et al. | |
| 7,083,988 B2 | 8/2006 | Deak | |
| 7,211,446 B2 | 5/2007 | Gaidis et al. | |
| 7,270,896 B2 | 9/2007 | Parkin | |
| 7,369,376 B2 | 5/2008 | Guo et al. | |

(Continued)

OTHER PUBLICATIONS

"Spin transfer switching current reduction in magnetic tunnel junction based dual spin filter structures," by Yiming Huai et al., Applied Physics Letters 87, 222510 (2005), American Institute of Physics, pp. 1-3.

(Continued)

*Primary Examiner* — Harry W Byrne
(74) *Attorney, Agent, or Firm* — Saile Ackerman LLC; Stephen B. Ackerman

(57) ABSTRACT

A MTJ that minimizes spin-transfer magnetization switching current (Jc) in a Spin-RAM to <$1\times10^6$ A/cm$^2$ is disclosed. The MTJ has a $Co_{60}Fe_{20}B_{20}/MgO/Co_{60}Fe_{20}B_{20}$ configuration where the CoFeB AP1 pinned and free layers are amorphous and the crystalline MgO tunnel barrier is formed by a ROX or NOX process. The capping layer preferably is a Hf/Ru composite where the lower Hf layer serves as an excellent oxygen getter material to reduce the magnetic "dead layer" at the free layer/capping layer interface and thereby increase dR/R, and lower Hc and Jc. The annealing temperature is lowered to about 280° C. to give a smoother CoFeB/MgO interface and a smaller offset field than with a 350° C. annealing. In a second embodiment, the AP1 layer has a CoFeB/CoFe configuration wherein the lower CoFeB layer is amorphous and the upper CoFe layer is crystalline to further improve dR/R and lower RA to $\leq 10$ ohm/μm$^2$.

18 Claims, 2 Drawing Sheets

U.S. PATENT DOCUMENTS

| | | | |
|---|---|---|---|
| 2005/0008849 A1* | 1/2005 | Kagami et al. | 428/328 |
| 2006/0017081 A1* | 1/2006 | Sun et al. | 257/295 |
| 2006/0102969 A1* | 5/2006 | Huai et al. | 257/421 |
| 2006/0141640 A1* | 6/2006 | Huai et al. | 438/3 |
| 2007/0148786 A1* | 6/2007 | Horng et al. | 438/2 |
| 2008/0023740 A1 | 1/2008 | Horng et al. | |
| 2008/0179699 A1 | 7/2008 | Horng et al. | |
| 2009/0243007 A1* | 10/2009 | Buttet et al. | 257/421 |

OTHER PUBLICATIONS

"230% room-temperature magnetoresistance in CoFeB/MgO/CoFeB magnetic tunnel junctions," by David D. Djayaprawira et al., Applied Physics Letters 86, 092502 (2005), American Institute of Physics, pp. 1-3.

"Emission of spin waves by a magnetic multilayer traversed by a current," by L. Berger, Physical Review B, vol. 54, No. 13, Oct. 1, 1996-I, The American Physical Society, pp. 9353-9358.

"Current-driven excitation of magnetic multilayers," by J.C. Slonczewski, Journal of Magnetism and Magnetic Materials 159 (1996), L1-L7, Letter to the Editor, Elsevier Science B.V.

"Spin transfer switching and spin polarization in magnetic tunnel junctions with MgO and AlOx barriers," by Zhitao Diao et al., Applied Physics Letters 87, 232502 (2005), pp. 1-3.

"A Novel Nonvolatile Memory with Spin Torque Transfer Magnetization Switching: Spin-RAM," by M. Hosomi et al., 2005 IEDM, paper 19-1.

"Multilayer configuration for experiments of spin precession induced by a dc current," by L. Berger, Journal of Applied Physics, vol. 93, No. 10, May 15, 2003, American Institute of Physics, pp. 7393-7695.

"Dependence of Giant Tunnel Magnetoresistance of Sputtered CoFeB/MgO/CoFeB Magnetic Tunnel Junctions on MgO Barrier Thickness and Annealing Temperature," by Jun Hayakawa et al., Japan Journal of Applied Physics, vol. 44, No. 19 (2005), pp. L587-L589, The Japan Society of Applied Physics.

Periodic table—Wikipedia, the free encyclopedia, found: Feb. 6, 2007, http://en.wikipedia.org/wiki/Periodic table, pp. 1-7.

"Current-Driven Magnetization Switching in CoFeB/MgO/CoFeB Magnetic Tunnel Junctions," by Jun Hayakawa et al., Japanese Journal of Applied Physics, vol. 44, No. 41, 2005, pp. L1267-L1270.

"Characterization of CoFeB electrodes for tunnel junctions," by S. Cardoso et al, Journal of Applied Physics 97, 10C916 (2005), American Institute of Physics, pp. 1-3.

"Annealing effects on structural and transport properties of rf-sputtered CoFeB/MgO/CoFeB magnetic tunnel junctions," by Chando Park et al., Journal of Applied Physics 99, 08A901 (2006) American Institute of Physics, pp. 1-3.

"Study of the dynamic magnetic properties of soft CoFeB films," by C. Bilzer et al., Journal of Applied Physics 100, 053903 (2006), American Institute of Physics, pp. 1-4.

* cited by examiner

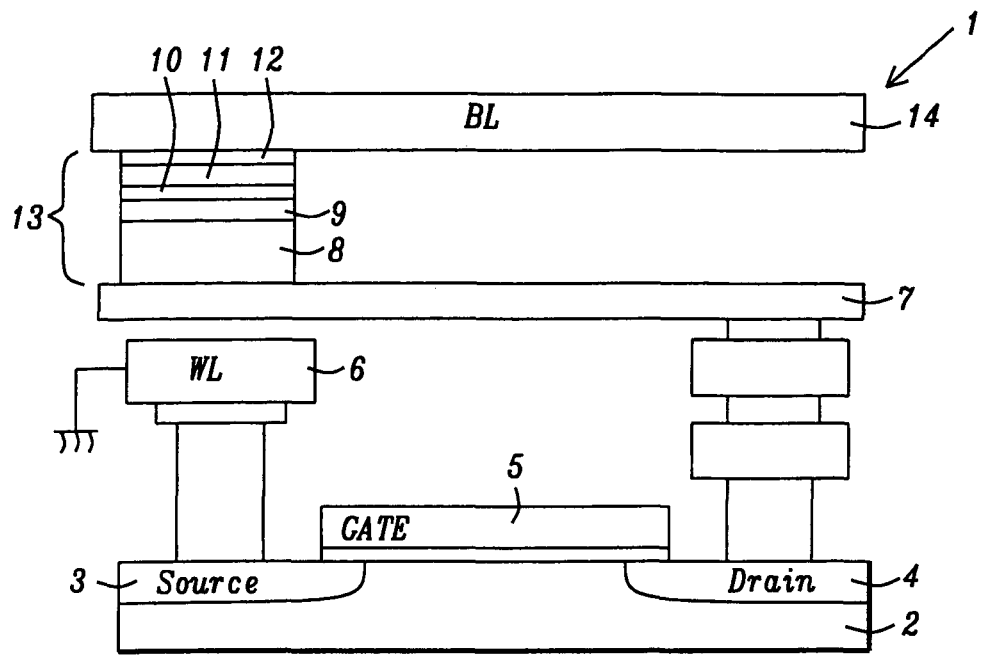
FIG. 1 – Prior Art
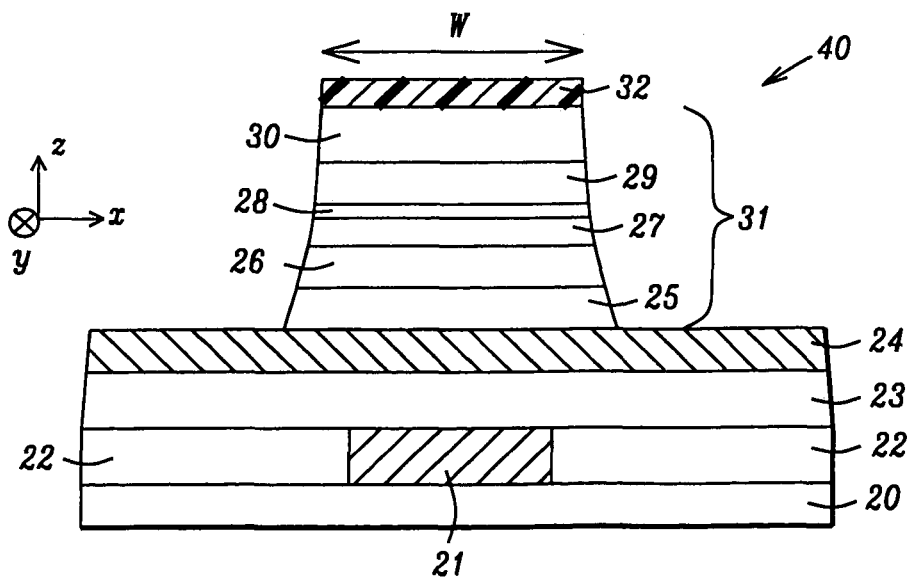
FIG. 2

MAGNETIC TUNNEL JUNCTION (MTJ) TO REDUCE SPIN TRANSFER MAGNETIZATION SWITCHING CURRENT

This is a Divisional application of U.S. patent application Ser. No. 11/699,875, filed on Jan. 30, 2007 now U.S. Pat. No. 7,598,579, which is herein incorporated by reference in its entirety, and assigned to a common assignee.

RELATED PATENT APPLICATIONS

This application is related to the following: Ser. No. 11/496,691, filing date Jul. 31, 2006; and Ser. No. 11/317,388, filing date Dec. 22, 2005, assigned to a common assignee.

FIELD OF THE INVENTION

The invention relates to a high performance Magnetic Tunneling Junction (MTJ) element and a method for making the same, and more particularly, to a configuration comprised of a composite AP1 pinned layer, a MgO barrier layer, an amorphous CoFeB free layer, and a Hf capping layer that minimizes the "dead layer" at the free layer/capping layer interface and reduces spin transfer magnetization switching current in a Spin-RAM device.

BACKGROUND OF THE INVENTION

Magnetoresistive Random Access Memory (MRAM), based on the integration of silicon CMOS with MTJ technology, is a major emerging technology that is highly competitive with existing semiconductor memories such as SRAM, DRAM, Flash, etc. A MRAM device is generally comprised of an array of parallel first conductive lines on a horizontal plane, an array of parallel second conductive lines on a second horizontal plane spaced above and formed in a direction perpendicular to the first conductive lines, and an MTJ element interposed between a first conductive line and a second conductive line at each crossover location. A first conductive line may be a word line while a second conductive line is a bit line or vice versa. Alternatively, a first conductive line may be a bottom electrode that is a sectioned line while a second conductive line is a bit line (or word line). There are typically other devices including transistors and diodes below the array of first conductive lines as well as peripheral circuits used to select certain MRAM cells within the MRAM array for read or write operations.

An MTJ element may be based on a tunneling magneto-resistance (TMR) effect wherein a stack of layers has a configuration in which two ferromagnetic layers are separated by a thin non-magnetic dielectric layer. In an MRAM device, the MTJ element is formed between a bottom electrode such as a first conductive line and a top electrode which is a second conductive line. An MTJ stack of layers that are subsequently patterned to form an MTJ element may be formed in a so-called bottom spin valve configuration by sequentially depositing a seed layer, an anti-ferromagnetic (AFM) pinning layer, a ferromagnetic "pinned" layer, a thin tunnel barrier layer, a ferromagnetic "free" layer, and a capping layer. The AFM layer holds the magnetic moment of the pinned layer in a fixed direction. In a MRAM MTJ, the free layer is preferably made of NiFe because of its reproducible and reliable switching characteristics as demonstrated by a low switching field (Hc) and switching field uniformity (σHc). Alternatively, an MTJ stack may have a top spin valve configuration in which a free layer is formed on a seed layer followed by sequentially forming a tunnel barrier layer, a pinned layer, AFM layer, and a capping layer.

The pinned layer has a magnetic moment that is fixed in the "y" direction, for example, by exchange coupling with the adjacent AFM layer that is also magnetized in the "y" direction. The free layer has a magnetic moment that is either parallel or anti-parallel to the magnetic moment in the pinned layer. The tunnel barrier layer is thin enough that a current through it can be established by quantum mechanical tunneling of conduction electrons. The magnetic moment of the free layer may change in response to external magnetic fields and it is the relative orientation of the magnetic moments between the free and pinned layers that determines the tunneling current and therefore the resistance of the tunneling junction. When a sense current is passed from the top electrode to the bottom electrode in a direction perpendicular to the MTJ layers, a lower resistance is detected when the magnetization directions of the free and pinned layers are in a parallel state ("1" memory state) and a higher resistance is noted when they are in an anti-parallel state or "0" memory state.

In a read operation, the information stored in an MRAM cell is read by sensing the magnetic state (resistance level) of the MTJ element through a sense current flowing top to bottom through the cell in a current perpendicular to plane (CPP) configuration. During a write operation, information is written to the MRAM cell by changing the magnetic state in the free layer to an appropriate one by generating external magnetic fields as a result of applying bit line and word line currents in two crossing conductive lines, either above or below the MTJ element. In certain MRAM architectures, the top electrode or the bottom electrode participates in both read and write operations.

A high performance MTJ element is characterized by a high magnetoresistive (MR) ratio which is dR/R where R is the minimum resistance of the MTJ element and dR is the change in resistance observed by changing the magnetic state of the free layer. A high MR ratio of over 130% and a low magnetostriction ($\lambda_S$) value of about $1 \times 10^6$ or less are desirable for Spin-RAM applications. This result is accomplished by (a) well controlled magnetization and switching of the free layer, (b) well controlled magnetization of a pinned layer that has a large exchange field and high thermal stability and, (c) integrity of the tunnel barrier layer. In order to achieve good barrier properties such as a specific junction resistance×area (RA) value and a high breakdown voltage (Vb), it is necessary to have a uniform tunnel barrier layer which is free of pinholes that is promoted by a smooth and densely packed growth in the AFM and pinned layers. Although a high RA value of about 10000 ohm-$\mu m^2$ is acceptable for a large area (A), RA should be relatively small (<1000 ohm-$\mu m^2$) for smaller areas. Otherwise, R would be too high to match the resistance of the transistor which is connected to the MTJ.

Generally, the purpose of the capping layer is to protect underlying layers in the MTJ during etching and other process steps and to function as an electrical contact to an overlying conductive line. The typical capping layer for an MTJ stack is a non-magnetic conductive metal such as Ta or TaN. During thermal annealing, Ta is capable of gettering oxygen atoms originating in the NiFe free layer. Consequently, the NiFe free layer is less oxygen contaminated and a more distinct boundary between the tunnel barrier layer and NiFe free layer is thereby obtained to improve dR/R. The disadvantage of using a Ta capping layer is that Ta diffuses into NiFe during thermal annealing, especially at high annealing temperatures (i.e. >250° C.) to produce an alloy that not only reduces free layer moment (Bs) but makes NiFe very magnetostrictive with a $\lambda_S$ of $\geq 5 \times 10^{-6}$. Thus, alternative capping layer materials are desirable that minimize inter-diffusion between a free layer and capping layer, serve as a good oxygen getter material, and enable both a high MR ratio and low λs value to be achieved in MTJs for advanced MRAM and TMR read head technologies.

Spin transfer (spin torque) magnetization switching as described by J. Sloneczewski in "Current-driven excitation of magnetic multilayers", J. Magn. Materials V 159, L1-L7 (1996), and by L. Berger in "Emission of spin waves by a magnetic multiplayer traversed by a current" in Phys. Rev. Lett. B, Vol. 52, p 9353 has stimulated considerable interest in recent years due to its potential application for spintronic devices such as MRAM on a gigabit scale. The spin-transfer effect arises from the spin dependent electron transport properties of ferromagnetic-spacer-ferromagnetic multilayers. When a spin-polarized current transverses a magnetic multilayer in a CPP configuration, the spin angular moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. As a result, spin-polarized current can switch the magnetization direction of the ferromagnetic layer if the current density is sufficiently high, and if the dimensions of the multilayer are small. The difference between a Spin-RAM and a conventional MRAM is only in the write operation mechanism. The read mechanism is the same.

Referring to FIG. 1, a memory cell 1 of a Spin-RAM includes a MTJ 13, word line (WL) 6, bit line (BL) 14, bottom electrode 7, and a CMOS transistor having a source 3, drain 4, and p-type semiconductor 2, for example, that provides current for switching the MTJ free layer 11. There is also a gate electrode 5. Additional layers in the MTJ 13 are an AFM layer 8, pinned layer 9, insulating barrier 10, and capping layer 12.

A critical current for spin transfer switching (Ic), which is defined as $[(Ic^+ + Ic^-)/2]$, for the present 180 nm node sub-micron MTJ having a top-down area of about 0.2×0.4 micron, is generally a few milliamperes. The critical current density (Jc), for example (Ic/A), is on the order of several $10^7$ A/cm$^2$. This high current density, which is required to induce the spin-transfer effect, could destroy a thin insulating barrier 10 such as AlOx, MgO, or the like. In order for spin-transfer magnetization switching to be viable in the 90 nm technology node and beyond, the critical current density (Jc) must be lower than $10^6$ A/cm$^2$ to be driven by a CMOS transistor that can typically deliver 100 μA per 100 nm gate width. For Spin-RAM applications, the (ultra-small) MTJs must exhibit a high tunnel magnetoresistance ratio (TMR or dR/R) much higher than the conventional MRAM-MTJ that use AlOx as a barrier layer and have a dR/R of about 40% as stated by Z. Diao et. al in "Spin transfer switching and spin polarization in MTJ with MgO and AlOx barrier", Appl. Phys. Left, 87, 232502 (2005). D. Djayaprawira et. al in "230% room temperature magnetoresistance in CoFeB/MgO/CoFeB MTJ", Appl. Phys. Lett. V 86, p. 092502 (2005) demonstrated that a highly oriented (001) CoFeB/MgO/CoFeB MTJ is capable of delivering dR/R>200%. Therefore, it is essential to find a way to combine a high TMR ratio of a CoFeB/MgO/CoFeB MTJ and the current driven switching capability necessary to make Spin-RAM a practical technology.

To apply spin-transfer switching to MRAM technology, it is desirable to decrease Ic (and its Jc) by more than an order of magnitude so as to avoid an electrical breakdown of the MTJ device and to be compatible with the underlying CMOS transistor that is used to provide switching current and to select a memory cell. A means to improve the dielectric breakdown voltage is also an important consideration.

The intrinsic critical current density (Jc) as given by Slonczewski of IBM is shown in equation (1) below.

$$Jc = 2e\alpha Mst_F(Ha + H_k + 2\pi Ms)/\hbar\eta \quad (1)$$

where e is the electron charge, α is a Gilbert damping constant, $t_F$ is the thickness of the free layer, $\hbar$ is the reduced Plank's constant, η is the spin-transfer efficiency which is related to the spin polarization (P), Ha is the external applied field, and $H_k$ and Ms are respectively, uniaxial anisotropy and magnetization of the free layer.

Normally, the demagnetizing field, 2πMs (several thousand Oe term) is much larger than the uniaxial anisotropy field Hk and external applied field (approximately 100 Oe) Ha term, hence the effect of Hk and Ha on Jc are small. In equation (2), V equals MS (tFA) and is the magnetic volume which is related to the thermal stability function term $K_uV/k_bT$ where $K_u$ is the magnetic anisotropy energy and $k_b$ is the Bolzmann constant.

$$Jc \propto \alpha MsV/P \quad (2)$$

A routine search of the prior art was conducted and the following references were found. Hosomi et al. in "A novel non-volatile memory with spin torque transfer magnetization switching: Spin-RAM", 2005 IEDM, paper 19-1, present a Spin-RAM with spin-torque transfer magnetization switching for the first time. Sony's Spin-RAM devices were fabricated with a $Co_{40}Fe_{40}B_{20}$/RF sputtered MgO/$Co_{40}Fe_{40}B_{20}$ (pinned layer/tunnel barrier/free layer) MTJ configuration that was processed with a 350° C.-10K Oe annealing. The CoFeB/MgO/CoFeB MTJ is employed for its high polarization (P) that provides a high output signal for TMR. MTJ size is 100 nm×150 nm with an oval shape. A tunnel barrier layer is made of crystallized (100) MgO whose thickness is controlled to <10 Angstroms for the proper RA of about 20 ohm-μm$^2$ while dR/R or TMR (intrinsic) of the MTJ is 160%. Using a 10 ns pulse width, the critical current density, Jc, for spin transfer magnetization switching is about $2.5 \times 10^6$ A/cm$^2$ which means Ic is equal to 375 μA. Due to a very small MTJ size, resistance distribution of Rp (low resistance state) and Rap (high resistance state) has a sigma (Rp_cov) around 4%. Thus, for a read operation, TMR (without bias)/Rp_cov=40 and this ratio is equivalent to that for a conventional CoFeB/AlOx/NiFe (pinned layer/tunnel barrier/free layer) MRAM MTJ configuration in which TMR is typically 40% with an Rp_cov of around 1%. Note that MTJ size in this case is 300 nm×600 nm. In addition, a CoFeB/AlOx/NiFe MRAM MTJ in a read operation is typically 300-350 mV biased. Under this condition, TMR (350 mV bias)/Rp_cov would be reduced to about 20.

A spin transfer magnetization switching of a $Co_{60}Fe_{20}B_{20}$/MgO/$Co_{60}Fe_{20}B_{20}$ MTJ is reported by Y. Huai et al. in "Spin transfer switching current reduction in magnetic tunnel junction based dual filter structures" in Appl. Physics Lett., V 87, p. 222, 510 (2005). The nominal MTJ size is 125 nm×220 nm with an RA of about 50 ohm-μm$^2$ and dR/R=155%. $Jc_0$ (i.e. Jc extrapolated to a pulse width of 1 ns) is $\sim 2 \times 10^6$ A/cm$^2$, similar to the Sony example. For a dual spin filter (DSF) structure wherein free layer switching is affected by two spin torques, Jc has been reduced to $\sim 1.3 \times 10^6$ A/cm$^2$.

In another reference by J. Hayakawa et al. entitled "Current-driven magnetization switching in CoFeB/MgO/CoFeB magnetic tunnel junctions", Japan J. Appl. Phys. V 44, p. 1267 (2005), a Jc (at a 10 ns pulse width) is reported as $7.8 \times 10^5$, $8.8 \times 10^5$, and $2.5 \times 10^6$ A/cm$^2$ for MTJs processed with 270° C., 300° C., and 350° C. annealing temperatures, respectively.

RA for the MTJ that has an 8.5 Angstrom MgO tunnel barrier thickness is about 10 ohm-$\mu m^2$. TMR (intrinsic) or dR/R ratios as a function of the three annealing temperatures for the $Co_{40}Fe_{40}B_{20}$/MgO/$Co_{40}Fe_{40}B_{20}$ MTJs with a 20 Angstrom thick $Co_{40}Fe_{40}B_{20}$ free layer are 49%, 73%, and 160%, respectively. It was found that a CoFeB free layer which is annealed at 270° C. or 320° C. is amorphous as described by S. Cardoso et. al in "Characterization of CoFeB electrodes for tunnel junction", J. Appl. Phys., V 97, p. 100916 (2005). On the other hand, a CoFeB free layer annealed at 350° C. is crystalline. It has been confirmed that the damping constant for an amorphous CoFeB layer is about half that of a crystalline CoFeB layer by C. Bilzer et. al in "Study of the dynamic magnetic properties of soft CoFeB films", J. Appl. Phys., V 100, p. 053903 (2006). Amorphous layers showed a low damping ($\alpha$=0.006) that is thickness dependent while crystalline CoFe with no B content has a value 2× higher ($\alpha$=0.013).

The aforementioned references can be summarized with the following four points: (1) Jc is greater than $2\times10^6$ A/cm$^2$ for a $CoFeB_{20}$/MgO/$CoFeB_{20}$ MTJ having a crystalline free layer; (2) a Jc less than $1.0\times10^6$ A/cm$^2$ can be achieved for a MTJ with an amorphous CoFeB free layer although dR/R is less than 100%; (3) a TMR (with bias)/Rp_cov (4%)>20 is required for a $CoFeB_{20}$/MgO/$CoFeB_{20}$ MTJ to be useful in a Spin-RAM application; and (4) Jc can be reduced in half by employing a dual spin filter (DSF) MTJ structure. However, to our knowledge, none of the prior art references has achieved a Jc less than $1.0\times10^6$ A/cm$^2$ and a dR/R over 120% together with a TMR (300 mV bias)/Rp_cov (4%) of at least 20 which is believed to be necessary for a Spin-RAM application. Furthermore, it is believed that the DSF MTJ structure may be too difficult to manufacture and that it is more desirable to fabricate a Spin-RAM device using a MTJ having a single spin valve structure.

In other prior art references, U.S. Pat. No. 6,831,312 discloses a list of amorphous alloys such as CoFeB and CoFeHf. Crystallization temperature for CoFeHf is >350° C. and for CoFeB is 325° C.-350° C. An amorphous free layer of CoFeB is also described in U.S. Patent Application 2005/0277206 and in U.S. Patent Application 2006/0003185. U.S. Pat. No. 6,990,014 teaches that an information recording layer comprises amorphous CoFeB. U.S. Patent Application 2006/0209590 discloses an amorphous CoFeB layer over a MgO tunnel barrier layer.

SUMMARY OF THE INVENTION

One objective of the present invention is to provide a MTJ element for a Spin-RAM device that has a configuration which is capable of achieving a Jc<$1.0\times10^6$ A/cm$^2$ and a TMR (300 mV bias)/Rp_cov (4%) of at least 20.

A second objective of the present invention is to provide a MTJ element having a single spin valve structure that satisfies the first objective.

A third objective of the present invention is to provide a MTJ element according to the first two objectives that produces an RA of about 10-20 $\Omega/\mu m^2$ and a dR/R of greater than 120% that is suitable for spin-transfer magnetization switching applications.

According to a first embodiment, these objectives are achieved by providing a substrate comprised of a bottom conductor electrode on which a Spin-RAM structure is to be fabricated. An MTJ element is formed by first depositing a stack of layers on the bottom conductor electrode. In one aspect, the MTJ stack has a bottom spin valve configuration in which a seed layer, AFM layer, synthetic anti-ferromagnetic (SyAF) pinned layer, tunnel barrier layer, free layer, and a capping layer are sequentially formed. Preferably, the pinned layer has a synthetic anti-ferromagnetic (SyAF) configuration wherein a Ru coupling layer is sandwiched between a lower CoFe (AP2) layer and an upper amorphous CoFeB (AP1) layer. The tunnel barrier layer may be comprised of crystalline MgO. Above the tunnel barrier layer is a free layer comprised of amorphous CoFeB. A Hf/Ru capping layer may be employed on the free layer. The lower layer in the capping layer is preferably Hf in order to reduce the magnetic "dead layer" at the free layer/capping layer interface. All of the layers in the MTJ stack are formed by sputtering or ion beam deposition (IBD). The MgO tunnel barrier layer is typically formed by depositing a first Mg layer, oxidizing the metal by a natural oxidation (NOX) or radical oxidation (ROX) method, and then depositing a second Mg layer on the oxidized first Mg layer. The MTJ is advantageously annealed at a temperature in the range of about 250° C. to 300° C. to ensure an amorphous character in the CoFeB pinned and free layers. Once all the layers in the stack are laid down and thermally annealed to fix the pinned layer magnetization direction, a conventional patterning and etching sequence is followed to fabricate a MTJ element. Thereafter, a dielectric layer is typically deposited on the substrate and MTJ, and is thinned to be coplanar with the capping layer. A top conductor may then be formed on the MTJ and dielectric layer.

In a second embodiment, the AP1 layer in the MTJ stack is modified by adding a crystalline CoFe layer on the amorphous CoFeB layer such that the CoFe layer contacts the MgO tunnel barrier. A $Co_{60}Fe_{20}B_{20}$ lower AP1 layer may be annealed at 265° C., for example, to form an amorphous layer that provides a smooth surface for growing smooth MTJ layers thereon. The CoFe upper AP1 layer preferably has a $Co_{75}Fe_{25}$ content with a body centered cubic (bcc) structure that is advantageously employed to grow an overlying (100) MgO tunnel barrier. The crystalline MgO tunnel barrier is formed by a ROX or NOX process as in the first embodiment. The capping layer may be Ta, Hf, or Zr.

BRIEF DESCRIPTION OF THE DRAWINGS

FIG. 1 is a cross-sectional view showing a conventional memory cell in a Spin-RAM device.

FIG. 2 is cross-sectional view of a partially formed Spin-RAM that has an MTJ structure according to one embodiment of the present invention.

DETAILED DESCRIPTION OF THE INVENTION

Figure 3:
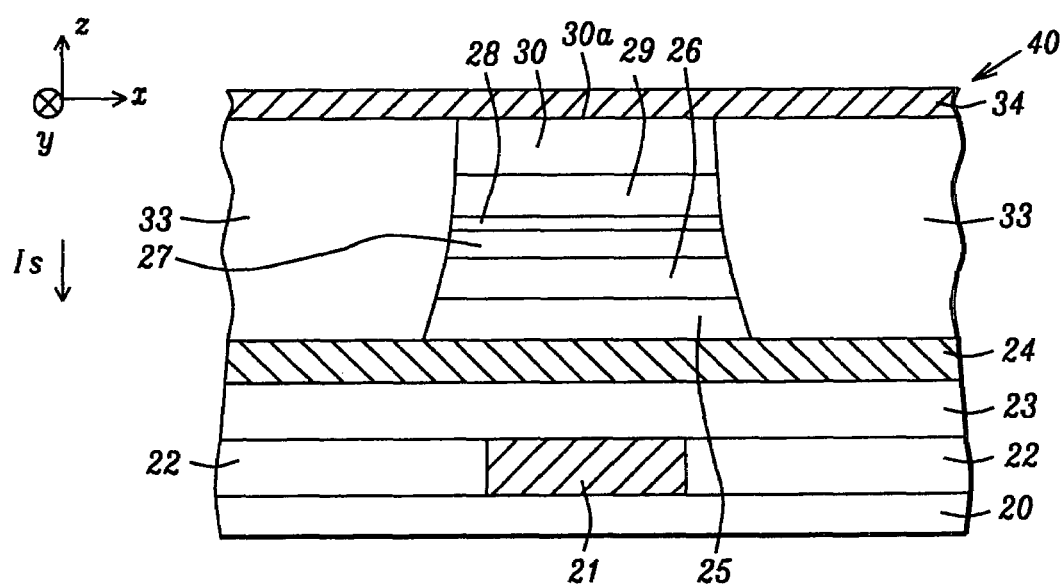
FIG. 3 is a cross-sectional view of the Spin-RAM structure in FIG. 2 after a photoresist mask is removed and an insulation layer is formed adjacent to the MTJ element and a bit line is formed on the top surface of the MTJ element.

The present invention is a MTJ configuration that provides a unique combination of a low Jc, low RA value, and high dR/R that is suitable for spin-transfer magnetization switching applications. Devices based on this technology may be referred to as Spin-RAM or STT-RAM devices. Drawings are provided by way of example and are not intended to limit the scope of the invention. Further, the drawings are not necessarily drawn to scale and the relative sizes of various elements may differ from those in an actual device.

A Spin-RAM structure formed according to a first embodiment of the present invention will now be described. Referring to FIG. 2, a partially completed Spin-RAM structure 40 is shown that includes a substrate 20 which may be silicon or another semiconductor substrate used in the art that typically contains devices such as transistors and diodes. A first insulation layer 22 comprised of $Al_2O_3$, silicon oxide, or the like is disposed on the substrate 20. There is a first conductive line comprised of copper, for example, formed within and coplanar with the first insulation layer 22. For the purpose of this discussion, the first conductive line is a word line 21 that is electrically connected to the transistor source electrode (not shown). Optionally, the first conductive line may be called a digit line, data line, row line, or column line as appreciated by those skilled in the art. Note that unlike conventional MRAM, magnetization switching in the Spin-RAM MTJ is accomplished by passing current through the MTJ and not by fields induced by current in the word line and bit line.

There is a second insulation layer 23 such as $Al_2O_3$ or silicon oxide formed on the word line 21 and first insulation layer 22. Above the second insulation layer 23 is a bottom conductor layer 24 that is interconnected to an underlying transistor (not shown) in substrate 20. The bottom conductor layer 24 may be a composite layer comprised of a lower seed layer, middle conductive layer, and upper capping layer (not shown). Furthermore, word line 21 and bottom conductor layer 24 may be connected to a source and drain of a transistor element, respectively, similar to the configuration depicted in FIG. 1 for word line 6 and bottom electrode 7.

It should be understood that the Spin-RAM structure is part of an array in which multiple parallel word lines are formed in a first conductive layer and multiple top conductor electrodes such as parallel bit lines are formed in a second conductive layer above an array of MTJs. Alternatively, the first conductive layer may be parallel bit lines while the second conductive layer is parallel word lines. The word lines and bit lines are aligned orthogonal to each other and a bottom conductor layer may be used to connect each MTJ element with a transistor in the substrate. In the exemplary embodiment, an MTJ element is formed between a bottom conductor layer and bit line at each location where a bit line crosses over a word line.

The bottom conductor layer 24 may be a sectioned line, for example, that has a rectangular shape in the x, y plane and a thickness in the z direction. Alternatively, the bottom conductor layer 24 may be a bit line that is aligned orthogonally to an underlying word line 21 and to a subsequently formed second word line above the MTJ. In one embodiment where the bottom conductor layer has a seed layer/conductive layer/capping layer configuration, the seed layer may be comprised of NiCr, Ta, or TaN. The conductive layer may be made of Ru, Rh, Ir or other metals such as Au, Cu, or α-Ta. The capping layer may be an amorphous Ta layer, for example, that serves to promote uniform and dense growth in subsequently formed MTJ layers.

An MTJ stack of layers is now formed on the bottom conductor layer 24. It should be understood that the MTJ stack may be formed in the same process tool as the bottom conductor layer. For instance, the bottom conductor layer 24 and MTJ stack may be formed in an Anelva C-7100 thin film sputtering system or the like which typically includes three physical vapor deposition (PVD) chambers each having five targets, an oxidation chamber, and a sputter etching chamber. At least one of the PVD chambers is capable of co-sputtering. Usually, the sputter deposition process involves: an argon sputter gas and the targets are made of metal or alloys to be deposited on a substrate. The bottom conductor layer 24 and overlying MTJ layers may be formed after a single pump down of the sputter system to enhance throughput.

In a preferred embodiment, the MTJ stack of layers 31 is fabricated on the bottom conductor layer 24 by sequentially forming a seed layer 25, AFM layer 26, SyAF pinned layer 27, tunnel barrier layer 28, free layer 29, and a capping layer 30. The seed layer 25 may have a thickness of about 40 to 60 Angstroms and is preferably a layer of NiCr with a thickness of 45 Angstroms and a Cr content of about 35 to 45 atomic %. However, NiFe, NiFeCr, or other suitable materials may be used as the seed layer 25 instead of NiCr. When the seed layer 25 is grown on an amorphous Ta capping layer in the bottom conductor layer 24, a smooth and dense (111) seed layer structure results that promotes smooth and densely packed growth in subsequently formed MTJ layers.

The AFM layer 26 is preferably made of MnPt with a thickness of about 100 to 200 Angstroms and more preferably 150 Angstroms although an IrMn layer having a thickness from about 50 to 100 Angstroms or a film made of NiMn, OsMn, RuMn, RhMn, PdMn, RuRhMn, or MnPtPd or the like is also acceptable. In the exemplary embodiment, the AFM layer is magnetically aligned in the y-axis direction. An external magnetic field may be applied during the deposition of an MTJ layer such as an AFM layer or a ferromagnetic (FM) layer to influence a magnetization along a certain axis.

The SyAF pinned layer 27 has an AP2/coupling layer/AP1 configuration. Use of a SyAF pinned layer in the MTJ structure not only improves thermal stability but also reduces the interlayer coupling field (offset field) applied to the free layer. The AP2 layer is formed on the AFM layer 26 and is preferably comprised of CoFe with a composition of about 25 atomic % Fe and with a thickness of about 20 to 30 Angstroms and more preferably 23 Angstroms. The magnetic moment of the AP2 layer is pinned in a direction anti-parallel to the magnetic moment of the AP1 layer. A slight difference in thickness between the AP2 and AP1 layers produces a small net magnetic moment for the SyAF pinned layer 26 along the y-axis. Exchange coupling between the AP2 layer and the AP1 layer is facilitated by a coupling layer that is preferably comprised of Ru with a thickness of about 7.5 Angstroms although Rh or Ir may be used instead of Ru. In a first embodiment, the AP1 layer on the Ru coupling layer has a thickness of about 15 to 25 Angstroms, and more preferably 20 Angstroms, and is comprised of amorphous CoFeB with a composition of about 40 to 60 atomic % Co, 20 to 40 atomic % Fe, and 15 to 25 atomic % B, and more preferably 60 atomic % Co, 20 atomic % Fe, and 20 atomic % B. It is important that the B content be at least 15% in order to achieve an amorphous CoFeB layer. The range for Fe content mentioned above is selected as a compromise between a high Fe content to increase the MR ratio and a low Fe content to maintain a low Hc value and low magnetostriction value.

Above the SyAF pinned layer 27 is formed a thin tunnel barrier layer 28 that is preferably MgO. Unlike a method commonly used in the prior art where a MgO tunnel barrier is formed by a sputter deposition method, the inventors advantageously employ a procedure where a Mg layer about 8 Angstroms thick is deposited followed by an in-situ radical oxidation (ROX) or natural oxidation (NOX), and then deposition of an additional Mg layer about 2 to 6 Angstroms thick. The resulting MgO tunnel barrier is believed to have a thickness greater than 10 Angstroms. Although other tunnel barrier layers such as AlOx or AlTiOx may be used instead of MgO, the performance of the MTJ element will not be as high as when a MgO tunnel barrier is employed. The tunnel barrier layer 28 has excellent smoothness and uniformity in part because of the smooth underlying MTJ layers. The ROX or NOX process is preferably performed in an oxidation chamber within the sputter deposition system. In one embodiment, the ROX process is comprised of a RF power of about 500 Watts and an oxygen flow rate of 0.4 to 0.8 standard liters per minute (slm) and preferably 0.6 slm for a period of about 15 to 50 seconds. Optionally, NOX process conditions comprised of a 1 torr pressure and an oxygen flow rate of from 0.1 to 1 slm and preferably 1 slm for about 60 to 120 seconds may be employed to oxidize the Mg layer on the SyAF pinned layer 27.

It has been shown that an MTJ made with a crystalline MgO barrier layer and a CoFeB free layer is capable of delivering a very high dR/R as described in the prior art references. High dR/R is a result of coherent tunneling in which electron symmetry of the ferromagnetic electrode is preserved in tunneling through the crystalline MgO barrier. Formation of an MgO tunnel barrier that optimizes MTJ performance with respect to Jc, RA, Rp_cov, and dR/R will be described in a later section.

The free layer 29 formed on the tunnel barrier layer 28 is preferably made of the same amorphous CoFeB composition as in the AP1 portion of the pinned layer 27, and more preferably has a $Co_{60}Fe_{20}B_{20}$ composition. The free CoFeB free layer 29 has a thickness between 20 and 30 Angstroms and is magnetically aligned along the y-axis (pinned layer direction). When the MTJ is elliptically shaped as seen in a top view (not shown), the easy axis of the MTJ element is along the long axis (y-direction).

Another important feature of the present invention is the capping layer 30 that is formed on the free layer 29. In a preferred embodiment, the capping layer 30 is a composite with a lower layer made of Hf with a thickness of from 5 to 50 Angstroms and an upper Ru layer having a thickness of from 20 to 100 Angstroms, and preferably 100 Angstroms. A capping layer with a lower Hf layer that contacts the free layer 29 has the effect of reducing the magnetic "dead layer" at the free layer/capping layer interface according to a mechanism explained previously in a related MagIC Technologies, Corp. patent application HMG06-011/012 which is herein incorporated by reference in its entirety. The so-called magnetic dead layer is typically a 3 to 6 Angstrom thick interface between the free layer and capping layer wherein some intermixing of layers has occurred. For example, in a conventional NiFe/Ru or NiFe/Ta free layer/capping layer configuration, Ru or Ta may migrate into a NiFe free layer and thereby reduce the magnetic moment of the free layer and dR/R of the MTJ. A magnetic dead layer is indicative of poor lattice matching and alloying between the free layer and adjoining capping layer. The mechanism for enhancing TMR (dR/R) is believed to be based on a capping layer that is highly effective in gettering oxygen from an adjacent free layer. Other elements such as Zr that have a good oxygen gettering capacity may be used in place of Hf as the lower layer in the composite capping layer. However, Hf is preferred over Zr as an oxygen gettering agent because it has a higher oxidation potential. Both Hf and Zr are believed to be better oxygen gettering agents than Ta because they have a lower electronegativity (higher oxidation potential) as listed in the on-line website http://en.wikipedia.org/wiki/Periodic_table.

Hafnium also has a higher oxidation potential than Ni, Fe, and Co and therefore is very effective in gettering oxygen from an adjacent free layer that is comprised of one or more of those elements. Previously, the inventors have practiced a process in which a Ru/Ta/Ru trilayer configuration was employed as a capping layer. However, the primary getter agent, Ta, is one layer removed from the free layer in this configuration and a Ru inner layer leads to dR/R degradation. Furthermore, the Bs is typically much higher for a Hf capping layer than for a Ta capping layer as shown in a later section. The upper layer in the capping layer 30 is preferably comprised of Ru to prevent oxidation of the lower Hf layer and to preserve the Hf oxidation potential. Other desirable properties of the upper Ru layer are that it ensures good electrical contact with an overlying bit line (not shown), is inert to oxidation during annealing, and is a low resistance conductor.

The present invention also encompasses an annealing step after all of the MTJ layers have been deposited. For example, in the exemplary embodiment, the MTJ stack of layers having an MgO tunnel barrier layer may be annealed in a vacuum by applying a magnetic field of 10K Oe in magnitude along the y-axis (easy axis) for 1 to 5 hours at a temperature of about 250° C. to 300° C., and preferably 1 hour at 265° C.

After all of the MTJ layers have been deposited and annealing is completed, an MTJ element 31 with sidewalls is fabricated by first coating and patterning a photoresist layer 32 that has a width w on the capping layer 30. Next, the photoresist layer 32 is employed as an etch mask during an IBE or Reactive Ion Etch (RIE) sequence that removes regions of the MTJ stack of layers 25-30 which are not protected by the etch mask. Optionally, a hard mask layer (not shown) such as Ta about 400 to 600 Angstroms thick may be deposited on the capping layer 30 prior to coating the photoresist layer 32. The patterned photoresist layer 32 serves as an etch mask during a RIE process to remove unprotected regions of the hard mask layer. Then the photoresist layer 32 is stripped and the hard mask serves as a mask for a second RIE process that etches unprotected regions of layers 25-30. As a result, an MTJ element 31 is formed that typically has sloped sidewalls in which the capping layer 30 has a width w and the seed layer 25 has a width greater than w.

Referring to FIG. 3, the photoresist layer 32 is removed after the aforementioned IBE or RIE etch sequence by a conventional method that may involve a wet stripper or an oxygen ashing process. A standard cleaning step may be performed at this point to ensure that all organic residue is removed after the stripping step. Then a third insulation layer 33 is formed on the bottom electrode 24 and adjacent to the MTJ sidewalls by a conventional method that may involve depositing an insulation material with an appropriate dielectric constant and then planarizing the third insulation layer 33 to be coplanar with the top surface 30a of the MTJ element.

The next step in fabricating the MRAM cell 40 is to form a top conductor (bit line) 34 on the third insulation layer 33 and that contacts the top surface 30a of the MTJ element. The bit line 34 is typically aligned in a direction orthogonal to that of the word line 21 and may be comprised of more than one layer. For instance, a top conductor layer such as Cu, Au, Ru, or Al may be enclosed on the sides and bottom by a diffusion barrier layer, which is also an adhesion layer, as appreciated by those skilled in the art. In the exemplary embodiment, the bit line 34 is used as a write line to carry current that passes through the MTJ 31 in a CPP (current perpendicular to plane) configuration. The spin-transfer effect arises from the spin-dependent electron transport properties of ferromagnetic-insulator-ferromagnetic multilayers. When a spin-polarized current transverses a magnetic multilayer in a CPP configuration, the spin angular moment of electrons incident on a ferromagnetic layer interacts with magnetic moments of the ferromagnetic layer near the interface between the ferromagnetic and insulator layers. Through this interaction, the electrons transfer a portion of their angular momentum to the ferromagnetic layer. As a result, a spin-polarized current can switch the magnetization direction of the ferromagnetic layer if the current density is sufficiently high, and if the dimensions of the multilayer are small. In addition, for spin transfer to be able to switch the magnetization direction of the free layer 29, the ferromagnetic layer (free layer) must be sufficiently thin.

COMPARATIVE EXAMPLE 1

An experiment was conducted to compare the performance of a MTJ fabricated according to the first embodiment of the present invention with a conventional MTJ based on a CoFeB/MgO/CoFeB pinned layer/tunnel barrier/free layer configuration described by J. Hayakawa et. al in Japan J. Appl. Phys. V 44, p. L587 (2005). In this experiment, RA is targeted at 50 $\Omega$-$\mu m^2$ and the free layer is made of $Co_{40}Fe_{40}B_{20}$. The MTJ stack is formed on a Ta/Ru200/$\alpha$-Ta100 bottom electrode and has the following succession of layers in order from bottom to top: 45 Angstrom NiCr seed layer; 150 Angstrom MnPt AFM layer; $Co_{75}Fe_{25}23/Ru7.5/Co_{60}Fe_{20}B_{20}21$ SyAF pinned layer; MgO tunnel barrier; 22 Angstrom $Co_{40}Fe_{40}B_{20}$ free layer; and a Ta/Ru capping layer. The MgO layer was RF sputter deposited in the Hayakawa method but in this experiment was formed by first depositing an 8 Angstrom thick Mg layer followed by a ROX process (500 Watts, 0.6 standard liters per minute of $O_2$) and then deposition of a 4 Angstrom thick Mg layer. TMR (dR/R) was found to be 130% and 189% for the MTJs with 280° C. and 360° C. annealing temperatures, respectively, in this experiment. It is noteworthy that the dR/R=130% for the 280° C. annealed MTJ is more than 2× the value reported by the Hayakawa reference. High dR/R indicates that the MgO formed by the Mg8-ROX—Mg4 process of the present invention, when annealed at 280° C., has already achieved good crystal orientation comparable to the RF-sputtered MgO with >350° C. annealing by Hayakawa. In terms of Bs, it should be noted that the Bs (0.72) of the 280° C. annealed MTJ is less than the Bs (0.78) of the crystalline CoFeB free layer with 360° C. annealing. The magnetic properties of the films in Table 1 were measured with a CIPT and B-H looper.

TABLE 1

Magnetic Properties of MTJs with
$Co_{60}Fe_{20}B_{20}/MgO(ROX)/Co_{40}Fe_{40}B_{20}$
pinned/tunnel barrier/free layer configuration

| Row | ROX | Cap | Anneal | RA | MR | Bs | Hc | He | Hk |
|---|---|---|---|---|---|---|---|---|---|
| 1 | 50 sec. | Ta50/Ru100 | 280° C. | 52 | 120% | 0.72 | 18.26 | −2.25 | 26.4 |
| 2 | 50 sec. | Ta50/Ru100 | 360° C. | 54 | 189% | 0.78 | 19.09 | −9.56 | 36.0 |

COMPARATIVE EXAMPLE 2

As shown previously in equation (2), Jc is scaled with Ms. It is known that the Ms of a $Co_{60}Fe_{20}B_{20}$ free layer is less than that of a $Co_{40}Fe_{40}B_{20}$ free layer. To further reduce Jc, the MTJ free layer in this invention is made of $Co_{60}Fe_{20}B_{20}$. The magnetic performance properties of MTJs having a $Co_{60}Fe_{20}B_{20}/MgO/Co_{60}Fe_{20}B_{20}$ pinned/tunnel barrier/free layer configuration are shown in Table 2. RA target for the MTJ in this experiment is 20 $\Omega\text{-}\mu m^2$. The other layers with the exception of the capping layer have the same composition and thickness as in the first experiment. In one example (row 2), the 50 Angstrom thick Ta portion of the composite capping layer is replaced by a 50 Angstrom thick Hf layer. The upper portion of the capping layer is a 100 Angstrom thick Ru layer. The MgO layer is formed with the same 500 W, 0.6 slm process as was used to generate the data in Table 1.

TABLE 2

Magnetic Properties of MTJs with
$Co_{60}Fe_{20}B_{20}/MgO(ROX)/Co_{60}Fe_{20}B_{20}$
pinned/tunnel barrier/free layer configuration

| Row | ROX | Cap | Anneal | RA | MR | Bs | Hc | He | Hk |
|---|---|---|---|---|---|---|---|---|---|
| 1 | 20 sec. | Ta50/Ru100 | 280 C. | 19 | 105% | 0.58 | 11.45 | 3.86 | 31.2 |
| 2 | 20 sec. | Hf50/Ru100 | 280 C. | 19 | 120% | 0.68 | 13.35 | 2.43 | 35.1 |
| 3 | 20 sec. | Ta50/Ru100 | 360 C. | 18 | 160% | 0.63 | 12.73 | −15.6 | 37.3 |

Comparing row 3 in Table 2 to row 2 in Table 1, the Bs of a $Co_{60}Fe_{20}B_{20}$ free layer is found to be less than the Bs of a $Co_{40}Fe_{40}B_{20}$ free layer as indicated by the ratio Bs($Co_{60}Fe_{20}B_{20}$)/($Co_{40}Fe_{40}B_{20}$)=0.63/0.78=0.81. Thus, Ms of a $Co_{60}Fe_{20}B_{20}$ free layer is about 80% that of a $Co_{40}Fe_{40}B_{20}$ free layer. Consequently, Hc for the $Co_{60}Fe_{20}B_{20}$ free layer is lower than Hc for the $Co_{40}Fe_{40}B_{20}$ layer. For RA=20 $\Omega\text{-}\mu m^2$, dR/R of the 360° C. and 280° C. annealed and Ta capped MTJs is 160% and 105%, respectively. Comparing row 1 to row 2 in Table 2, it is interesting to note that for 280° C. annealed MTJs, a Hf cap leads to a significantly higher Bs (0.68) than with a Ta cap (0.58). Thus, a Hf cap has the effect of reducing the magnetic "dead layer" that occurs at the CoFeB free layer/capping layer interface. Another advantage is that the Hf capped MTJ has a higher dR/R than for a Ta capped MTJ. When considering the entire MTJ stack, He is related to the roughness of the CoFeB/MgO interface and the so-called Neel orange peel effect as understood by those skilled in the art. As shown in Table 2, He for the 280° C. annealed MTJ is lower (in absolute value) than for a 360° C. annealed MTJ which means the 280° C. MTJ has a smoother pinned layer/tunnel barrier interface. The smooth $Co_{60}Fe_{20}B_{20}$/MgO interface tends to confirm that the MgO tunnel barrier fabricated according to the present invention is formed on top of an amorphous CoFeB AP1 pinned layer. Thus, it follows that the $Co_{60}Fe_{20}B_{20}$ free layer in a 280° C. annealed MTJ is also amorphous. During a writing operation to achieve a symmetrical R-I response, for example $Ic^+ \sim Ic^-$, a much lower offset field $H_{off}$(Ha) is necessary for the 280° C. annealed MTJ compared with a 360° C. annealed MTJ which is yet another advantage provided by the preferred embodiment of the present invention that comprises a low annealing temperature such as 280° C.

Another piece of information relevant to the present invention is provided by C. Bilzer et. al in "Study of the dynamic magnetic properties of soft CoFeB films", J. Appl. Phys., V 100, p. 053903 (2006) where a MTJ with an amorphous free layer was shown to have a lower damping constant α than a MTJ with a crystalline free layer. Thus, an additional advantage afforded by the MTJ configuration of the present invention is a lower Jc than MTJs based on crystalline CoFeB layers because of equation (2) where Jc is proportional to "α". As the damping constant decreases, the switching current also decreases which is desirable for Spin-RAM applications.

With respect to Rp_cov, a comparison in MRAM technology has been made between a CoFeB/AlOx/NiFe MTJ and a CoFeB/MgO/NiFe MTJ that are both annealed at 280° C. In the former, AlOx is amorphous, and in the latter case, MgO is crystalline as is the overlying NiFe free layer. It has been found that in a MRAM device, the Rp_cov for a CoFeB/MgO/NiFe MTJ in is 2× greater than for a CoFeB/AlOx/NiFe MTJ. In the Sony Spin-RAM example mentioned previously, CoFeB/MgO/CoFeB has a crystalline/crystalline/crystalline structure that results in a Rp_cov=4%. It is very likely that a Rp_cov much less than 4% can be achieved for a Spin-RAM made of a CoFeB (amorphous)/MgO (crystalline)/CoFeB (amorphous) MTJ as in the present invention. Although a TMR/Rp_cov ratio has not been determined as yet for the MTJ structure as disclosed in the first embodiment, it is expected that the Rp_cov value will be 3% or less and the resulting TMR/Rp_cov=120%/3%=40 will achieve the desired spin-transfer requirement as stated earlier.

When compared to a conventional Ta capped MTJ, a Hf capped MTJ according to the present invention in which the capping layer has a Hf/Ru configuration has the advantages of higher output signal (dR/R), smaller offset field (Hoff), and a reduced magnetic "dead layer". Furthermore, in terms of the thermal stability parameter ($K_UV/K_bT$), a Hf capped MTJ accordingly has an advantage over a Ta capped MTJ.

COMPARATIVE EXAMPLE 3

Another experiment was performed to determine the effect of employing a NOX process rather than a ROX process in forming the MgO tunnel barrier layer. Otherwise, the composition and thickness of the various layers in the NOX-MTJ are the same as in Table 2. In rows 2-4 of Table 3, the MgO layer is formed by a natural oxidation (NOX) process wherein an 8 Angstrom thick Mg layer is laid down on the CoFeB pinned layer followed by the NOX step and then a second Mg layer having a thickness of 4 Angstroms is deposited. The NOX process comprises exposure of an 8 Angstrom thick Mg layer to a 1 torr atmosphere by using an $O_2$ flow rate of 1 standard liter per minute (slm) for a period of 60 to 100 seconds.

TABLE 3

Magnetic Properties of MTJs with $Co_{60}Fe_{20}B_{20}$/MgO ROX (NOX)/$Co_{60}Fe_{20}B_{20}$ pinned/tunnel barrier/free layer configuration

| Row | ROX(NOX) | Cap | Anneal | RA | MR | Bs | Hc | He | Hk |
|---|---|---|---|---|---|---|---|---|---|
| 1 | ROX 15 sec. | Ta50/Ru100 | 280 C. | 11 | 96% | 0.59 | 10.96 | 8.55 | 34.2 |
| 2 | NOX 60 sec. | Ta50/Ru100 | 280 C. | 9.7 | 103% | 0.61 | 10.20 | 3.73 | 37.53 |
| 3 | NOX 60 sec. | Hf50/Ru100 | 280 C. | 9.8 | 110% | 0.69 | 11.33 | 3.26 | 43.21 |
| 4 | NOX 80 sec. | Ta50/Ru100 | 360 C. | 12 | 164% | 0.64 | 12.73 | −21.0 | 40.6 |

Referring to row 1 in Table 3, when ROX cycle time is reduced from 20 seconds to 15 seconds, a RA target of 10 $\Omega$-$\mu m^2$ is obtained. However, the dR/R is lowered to 96%. The magnetic performance of NOX-MTJs formed according to a first embodiment of the present invention is listed in rows 2 to 4. Comparing row 1 to row 2, it is obvious that He is much lower for the NOX-MTJ than for the ROX-MTJ. For a 280° C. annealed NOX-MTJ, a dR/R above 100% is achieved. Again, a Hf capped MTJ delivers a higher dR/R and lower He (row 3 vs. row 2) than a Ta capped MTJ. Therefore, for a lower RA of about 10 $\Omega$-$\mu m^2$, it is preferable to form a MgO tunnel barrier by employing a NOX process according to the present invention as well as incorporating amorphous CoFeB pinned and free layers, and Hf as the bottom layer in the capping layer.

In addition to a dR/R>100%, a low RA value and low He, the first embodiment of the present invention also provides a Jc (critical current density) of less than $1 \times 10^6$ A/cm², a substantial improvement over prior art examples where magnetization switching due to a spin-transfer effect is $>2 \times 10^6$ A/cm², too high to be useful for Spin-RAM applications. A MTJ having an [amorphous CoFeB/MgO (ROX or NOX)/amorphous CoFeB] AP1 pinned layer/tunnel barrier/free layer configuration with a capping layer made of a lower Hf layer and an upper Ru layer substantially minimizes the size of the "dead layer" between the free layer and capping layer thereby enabling a higher dR/R to be realized. However, in a read operation where the MTJ is 300 mV biased, TMR is lowered to around 60%. As a result, TMR/(Rp_cov=4%)=15 which is slightly below the desired value of 20 for a Spin-RAM. Thus, further improvement in TMR (dR/R) for the MTJ according to the objectives set forth in the present invention is desirable.

In a second embodiment, the same elements are retained from the first embodiment except that the AP1 portion of the SyAF pinned layer 27 is modified and has a composite configuration wherein an amorphous CoFeB lower AP1 layer is formed adjacent to the coupling layer (Ru, Rh, Ir) and a crystalline CoFe upper AP1 layer is formed adjacent to the MgO tunnel barrier. The amorphous CoFeB lower AP1 layer has the same composition as described previously but the thickness is reduced to a range of 12 to 18 and preferably 15 Angstroms. The crystalline CoFe upper AP1 layer has a Fe content between 20 and 40 atomic %, and preferably 25 atomic %, and a thickness between 5 and 7 Angstroms, and preferably 6 Angstroms. Thus, in a preferred embodiment, the AP1 layer is comprised of a lower $Co_{60}Fe_{20}B_{20}$ layer and an upper $Co_{75}Fe_{25}$ layer. The capping layer 30 may be made of Hf, Zr, or Ta. The same process flow is followed to form the MTJ element as described in the first embodiment with the exception of the deposition of an additional $Co_{75}Fe_{25}$ layer as the upper layer in the AP1 composite stack. The annealing process for the MTJ stack of layers preferably comprises applying a 10000 Oe field for 1 to 2 hours at about 265° C.

COMPARATIVE EXAMPLE 4

An experiment was performed to compare a MTJ made according to the second embodiment of the present invention with an MTJ similar to that described in the Hosomi and Hayakawa prior art references shown in row 1 of Table 4. The composition and thickness of the various layers in the ROX-MTJ are the same as in Table 2 with the exception of rows 3-4 where a composite AP1 layer formed according to the present invention is employed. The AP2/coupling layer portion of the pinned layer ($Co_{75}Fe_{25}$) 23/Ru 7.5 is the same as in earlier examples. The ROX process used for each row in Table 4 is 500 W and 0.6 slm $O_2$ flow rate for 20 seconds.

TABLE 4

Magnetic Properties of MTJs with AP1/MgO ROX/$Co_{60}Fe_{20}B_{20}$ 20 pinned/tunnel barrier/free layer configuration

| Row | AP1 | Cap | Anneal | RA | MR | Bs | Hc | He | Hk |
|---|---|---|---|---|---|---|---|---|---|
| 1 | $Co_{60}Fe_{20}B_{20}$ 21 | Ta50/Ru100 | 360 C. | 12 | 160% | 0.60 | 12.7 | −21.0 | 40.6 |
| 2 | $Co_{60}Fe_{20}B_{20}$ 21 | Ta50/Ru100 | 265 C. | 16 | 72% | 0.49 | 8.9 | 10.2 | 34.4 |
| 3 | $Co_{60}Fe_{20}B_{20}$ 15/ $Co_{75}Fe_{25}$ 6 | Ta50/Ru100 | 265 C. | 11 | 123% | 0.51 | 8.8 | 3.41 | 31.2 |
| 4 | $Co_{60}Fe_{20}B_{20}$ 15/ $Co_{75}Fe_{25}$ 6 | Hf50/Ru100 | 265 C. | 11 | 133% | 0.61 | 11.3 | 3.21 | 36.8 |

The prior art MTJ listed in row 1 in Table 4 has fully crystalline $Co_{60}Fe_{20}B_{20}$ AP1 and $Co_{60}Fe_{20}B_{20}$ free layers because of the 360° C. (2 hrs, 10000 Oe) annealing process. The dR/R=160% is similar to the values cited for this type of MTJ in the prior art that have a 350° C. annealing temperature. Note that the Bs of the free layer is 0.60 nw while the Bs for the MTJ stack in row 2 which was annealed for 2 hours at 265° C. with a 10000 Oe applied field is 0.49 nw for a ratio of 0.60/0.49=1.22. Again, this result is comparable to the ratio obtained in the Hayakawa reference for Bs [350° C. annealed MTJ stack (CoFeB free layer)]/Bs [270° C. annealed MTJ stack]=1.6T/1.3T=1.23. C. Park et. al in "Annealing effects on structure and transport properties of rf-sputtered CoFeB/MgO/CoFeB magnetic tunnel junction", J. Appl. Phys. V 99, 08A901 (2006), shows that the $Co_{60}Fe_{20}B_{20}$ free layer after 270° C. annealing is amorphous while a $Co_{60}Fe_{20}B_{20}$ free layer after 360° C. annealing is crystalline. It follows that the $Co_{60}Fe_{20}B_{20}$ AP1 and $Co_{60}Fe_{20}B_{20}$ free layer of the present invention will also remain amorphous after a 265° C. annealing process. Referring to row 2 of Table 4, dR/R=72% for the 265° C. annealed MTJ is higher than dR/R reported in the Hayakawa reference. However, dR/R=72% is still lower than dR/R=96% for the same MTJ stack made with 280° C. annealing. This discrepancy may be explained by the Park reference which postulates that for 280° C. annealing, the amorphous $Co_{60}Fe_{20}B_{20}$ free layer is locally crystallized at the MgO/CoFeB interface.

Another advantage of the present invention is that MgO tunnel barrier layers in the prior art such as in the Sony and Hayakawa references are formed by RF sputtering from a dielectric target hereafter referred to as Sput-MgO whereas the MgO tunnel barrier formed herein is made by a ROX or NOX process of a Mg deposited layer as described earlier. A higher dR/R demonstrated by the MTJ in row 2 than the dR/R=49% in the prior art reference means that a MgO layer having a highly oriented (100) crystal structure is more favorably formed in the MTJs of the present invention than by a Sput-MgO process.

Since better MgO orientation yields higher dR/R for an MTJ, we attempted to achieve even higher dR/R values than in the first embodiment by optimizing the AP1 "substrate" on which the tunnel barrier layer is formed. During our investigation, we discovered that a composite AP1 layer wherein a lower amorphous $Co_{60}Fe_{20}B_{20}$ layer having a smooth surface and an upper $Co_{75}Fe_{25}$ layer with a bcc crystal structure provides further improvement in the dR/R ratio of a MTJ comprised of a crystalline (100) MgO (ROX/NOX) layer and an amorphous CoFeB free layer. In row 3 of Table 4, a dR/R>120% is achieved with a Ta capping layer and with a 265° C. annealing temperature. The dR/R increases to >130% under the same process conditions when a Hf capping layer is employed and Bs for this MTJ in row 4 is equivalent to that of a 360° C. annealed free layer. Another improvement when switching to the composite AP1 layer of the second embodiment is that the RA is reduced from 16 ohm-μm² (row 2) to 11 ohm-μm² in row 3. Moreover, the interlayer coupling field (He) between the pinned layer and free layer is considerably decreased and thereby reduces the Ha (Hoff) term in equation (1). It should also be pointed out that the MgO layer formed herein has a thickness of about 10 Angstroms which is greater than the Sput-MgO generated tunnel barriers in prior art. As a result, the $V_{dB}$ (dielectric breakdown voltage) for the thicker ROX—MgO layer of the present invention is measured to be >1.2 volts, substantially higher than that of the prior art.

COMPARATIVE EXAMPLE 5

Another experiment was conducted to evaluate MTJs in which the MgO tunnel barrier layer is formed by a NOX process as described previously with regard to Table 3 and Comparative Example 3. The MgO layer is prepared by depositing an 8 Angstrom thick Mg layer on the AP1 layer followed by a NOX process comprised of an $O_2$ flow rate of 1 slm and at 1 torr pressure for about 80 to 300 seconds. Otherwise, the composition and thickness of the various layers in the NOX-MTJs in rows 1-4 of Table 5 are the same as in the corresponding rows in Table 4 with the exception of row 1 where the free layer thickness is increased from 20 to 22 Angstroms due to interdiffusion between the free layer and Ta capping layer.

TABLE 5

Magnetic Properties of MTJs with AP1/MgO NOX/$Co_{60}Fe_{20}B_{20}$ 20 pinned/tunnel barrier/free layer configuration

| Row | NOX | AP1 | Cap | Anneal | RA | MR | Bs | Hc | He | Hk |
|---|---|---|---|---|---|---|---|---|---|---|
| 1 | 80" | $Co_{60}Fe_{20}B_{20}$ 21 | Ta50/Ru100 | 360 C. | 9 | 166% | 0.64 | 11.5 | −18.7 | 40.3 |
| 2 | 80" | $Co_{60}Fe_{20}B_{20}$ 21 | Ta50/Ru100 | 265 C. | 10 | 81% | 0.49 | 9.63 | 6.45 | 33.6 |
| 3 | 300" | $Co_{60}Fe_{20}B_{20}$ 15/ $Co_{75}Fe_{25}$ 6 | Ta50/Ru100 | 265 C. | 6 | 130% | 0.51 | 9.79 | 2.73 | 31.5 |
| 4 | 300" | $Co_{60}Fe_{20}B_{20}$ 15/ $Co_{75}Fe_{25}$ 6 | Hf20/Ru100 | 265 C. | 6 | 143% | 0.63 | 12.5 | 1.68 | 36.1 |

Compared to the ROX—MgO MTJs in Table 4, the MTJs fabricated with a NOX—MgO layer yield a higher dR/R and a lower RA value of $\leq 10$ ohm-$\mu m^2$. Thus, the NOX—MgO MTJs according to the present invention not only result in a smaller RA but a smaller He. In the row 4 example with a Hf capping layer, the dR/R is as high as 143% which is almost 3× greater than the result reported in the Hayakawa reference.

With regard to Rp_cov, a comparison can be made in a 1-Mbit MRAM for the CoFeB/AlOx/NiFe MTJ and the CoFeB/MgO/NiFe MTJ. In the former, AlOx is amorphous and in the latter, MgO is crystalline along with the NiFe free layer. The Rp_cov for the former with both a crystalline (MgO) tunnel barrier and a crystalline NiFe free layer is 2× that of the MTJs with an amorphous (AlOx) tunnel barrier and a crystalline NiFe free layer. In Sony's Spin-RAM reference cited previously, MgO/CoFeB has a (crystalline/crystalline) interface structure to give a Rp_cov=4%. Considering the reduction in Rp_cov by employing a (crystalline/amorphous) interface structure in the 1-Mbit MRAM comparison above, we believe that the Rp_cov of the present invention that has a crystalline/amorphous interface and a MgO/CoFeB tunnel barrier/free layer configuration should be substantially reduced below 4%.

Spin-RAM has two reliability issues. One is thermal instability that depends on free layer volume (V) and the second is the lifetime of the tunneling oxide that depends on the thickness of the tunnel barrier. In a preferred embodiment of the present invention where the capping layer is comprised of Hf, the free layer has in effect a greater thickness due to a thinning of the "dead layer" than when a capping layer with a lower oxidation potential is used. In other words, the volume (V) of the free layer is increased and thermal stability improves since V is related to the thermal stability function term $K_u V/k_b T$. Therefore, the MTJ structure of the present invention has the beneficial effect of improved stability based on a reduction in dead layer volume to increase the effective volume of free layer at the same physical thickness, and because of a thicker MgO tunnel barrier which improves the tunneling oxide lifetime. With a dR/R of $\geq 130\%$ and a Rp_cov believed to be substantially less than 4% as provided by an MTJ according to the second embodiment of the present invention, a Jc value reduction to $<1 \times 10^6$ A/cm$^2$ is anticipated.

While this invention has been particularly shown and described with reference to, the preferred embodiment thereof, it will be understood by those skilled in the art that various changes in form and details may be made without departing from the spirit and scope of this invention.

We claim:

1. A method of forming an MTJ element on a substrate in a magnetic device, comprising:
    (a) forming a pinned layer in a MTJ stack of layers wherein the pinned layer has an AP2/coupling layer/AP1 configuration in which the AP2layer is formed on an AFM layer and the AP1 layer is made of amorphous CoFeB;
    (b) forming a crystalline MgO tunnel barrier on the amorphous CoFeB AP1 pinned layer by a method that comprises a radical oxidation (ROX) or natural oxidation (NOX) of a Mg layer;
    (c) forming an amorphous CoFeB free layer on the MgO barrier layer, the free layer has a composition in which an atomic % of each of Co, Fe, and B is equivalent to that of the AP1 layer; and
    (d) forming a composite capping layer on said amorphous CoFeB free layer wherein said composite capping layer is comprised of a lower layer made of a metal having an oxidation potential greater than that of Co, Fe, and Ta to provide a high oxygen gettering capability, and an upper layer.

2. The method of claim 1 wherein the substrate is a bottom conductor in a Spin-RAM structure and the MTJ stack is further comprised of a seed layer on the substrate and an AFM layer on the seed layer.

3. The method of claim 1 wherein all layers in the MTJ stack are laid down in a low pressure sputter deposition system having multiple chambers including an oxidation chamber for the ROX or NOX step.

4. The method of claim 1 wherein the amorphous CoFeB AP1 pinned layer and amorphous CoFeB free layer have a composition represented by $Co_x Fe_y B_z$ where x is from about 40 to 60 atomic %, y is from about 20 to 40 atomic %, and z is from about 15 to 25 atomic %.

5. The method of claim 1 further comprised of annealing the MTJ stack of layers at a temperature of about 250° C. to 300° C. with an applied magnetic field of about 10000 Oersted for about 1 to 5 hours.

6. The method of claim 1 wherein forming the MgO layer comprises depositing a first Mg layer about 8 Angstroms thick on the amorphous CoFeB AP1 pinned layer followed by a ROX process comprising about 500 Watts RF power and with a flow rate of about 0.6 slm $O_2$ for about 15 to 50 seconds, and then deposition of a second Mg layer about 2 to 6 Angstroms thick on the oxidized first Mg layer.

7. The method of claim 1 wherein forming the MgO layer comprises depositing a first Mg layer about 8 Angstroms thick on the amorphous CoFeB pinned layer followed by a NOX oxidation comprising exposure of the first Mg layer to about 1 torr pressure and with a flow rate of about 1 slm $O_2$ for about 50 to 100 seconds, and then deposition of a second Mg layer about 2 to 6 Angstroms thick on the oxidized first Mg layer.

8. The method of claim 1 wherein the lower layer of the composite capping layer is comprised of Hf or Zr with a thickness of about 5 to 50 Angstroms and the upper layer is made of Ru having a thickness of about 20 to 100 Angstroms.

9. A method of forming an MTJ element on a substrate in a magnetic device, comprising:
    (a) forming a pinned layer in a MTJ stack of layers wherein the pinned layer has an AP2/coupling layer/AP1 configuration in which the AP2layer is formed on an AFM layer and the AP1 layer is a composite having a lower amorphous CoFeB layer and an upper crystalline CoFe layer;
    (b) forming a crystalline MgO tunnel barrier on the crystalline CoFe layer in the composite AP1 pinned layer by a method that comprises a radical oxidation (ROX) or natural oxidation (NOX) of a Mg layer;
    (c) forming an amorphous CoFeB free layer on the MgO barrier layer, the free layer has a composition in which an atomic % of each of Co, Fe, and B is equivalent to that of the lower AP1 layer; and
    (d) forming a capping layer on the CoFeB free layer wherein the capping layer is comprised of a metal layer having an oxidation potential greater than that of Co and Fe to provide a high oxygen gettering capability and said metal layer contacts said amorphous CoFeB layer.

10. The method of claim 9 wherein the substrate is a bottom conductor in a Spin-RAM structure and the MTJ stack is further comprised of a seed layer on the substrate and an AFM layer on the seed layer.

11. The method of claim 9 wherein all layers in the MTJ stack are laid down in a low pressure sputter deposition system having multiple chambers including an oxidation chamber for the ROX or NOX step.

12. The method of claim 9 wherein the lower amorphous CoFeB AP1 pinned layer and amorphous CoFeB free layer have a composition represented by $Co_xFe_yB_2$ where x is from about 40 to 60 atomic %, y is from about 20 to 40 atomic %, and z is from about 15 to 25 atomic %.

13. The method of claim 9 wherein the upper crystalline CoFe AP1 layer has a composition represented by $Co_xFe_y$ where y is from about 20 to 40 atomic % and said CoFe AP1 layer has a body centered cubic (bcc) crystal structure.

14. The method of claim 9 wherein the metal layer in the capping layer is comprised of Ta, Hf, or Zr.

15. The method of claim 9 further comprised of annealing the MTJ stack of layers-at a temperature from about 250° C. to 300° C. with an applied magnetic field of about 10000 Oersted for about 1 to 5 hours.

16. The method of claim 9 wherein forming the MgO layer comprises depositing a first Mg layer about 8 Angstroms thick on the upper crystalline CoFe layer in the composite AP1 pinned layer followed by a ROX process comprising about 500 Watts RF power and a flow rate of about 0.6 slm $O_2$ for about 15 to 50 seconds, and then deposition of a second Mg layer about 2 to 6 Angstroms thick on the oxidized first Mg layer.

17. The method of claim 9 wherein forming the MgO layer comprises depositing a first Mg layer about 8 Angstroms thick on the upper crystalline CoFe layer in the composite AP1 pinned layer followed by a NOX oxidation comprising exposure of the first Mg layer to about 1 torr pressure and a $O_2$ flow rate of about 1 slm for about 80 to 300 seconds, and then deposition of a second Mg layer about 2 to 6 Angstroms thick on the oxidized first Mg layer.

18. The method of claim 14 wherein the capping layer is further comprised of a layer of Ru on the Ta, Hf, or Zr metal layer.

* * * * *